United States Patent
Agarwal et al.

(10) Patent No.: US 11,742,810 B2
(45) Date of Patent: Aug. 29, 2023

(54) CLASS AB BUFFER WITH MULTIPLE OUTPUT STAGES

(71) Applicant: TEXAS INSTRUMENTS INCORPORATED, Dallas, TX (US)

(72) Inventors: Nitin Agarwal, Bengaluru (IN); Aniruddha Roy, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 94 days.

(21) Appl. No.: 17/379,046

(22) Filed: Jul. 19, 2021

(65) Prior Publication Data

US 2021/0344314 A1 Nov. 4, 2021

Related U.S. Application Data

(63) Continuation of application No. 16/395,334, filed on Apr. 26, 2019, now Pat. No. 11,070,180.

(51) Int. Cl.
*H03F 3/45* (2006.01)
*H03F 3/30* (2006.01)
*H03F 1/22* (2006.01)

(52) U.S. Cl.
CPC .......... *H03F 3/3016* (2013.01); *H03F 1/223* (2013.01); *H03F 2200/129* (2013.01)

(58) Field of Classification Search
CPC .. H03F 3/3016; H03F 1/223; H03F 2200/129; H03F 2203/45352; H03F 3/45183; H03F 3/45188; H03F 3/45192
USPC .......... 330/277, 253, 254, 255, 267
See application file for complete search history.

(56) References Cited

U.S. PATENT DOCUMENTS

| | | | |
|---|---|---|---|
| 6,714,076 B1 | 3/2004 | Kalb | |
| 7,504,882 B2 | 3/2009 | Saito | |
| 2008/0303595 A1* | 12/2008 | Lee | H03F 3/45179 330/277 |

* cited by examiner

*Primary Examiner* — Hafizur Rahman
*Assistant Examiner* — Khiem D Nguyen
(74) *Attorney, Agent, or Firm* — Krista Y. Chan; Frank D. Cimino

(57) ABSTRACT

A class AB buffer includes an output stage and an input stage. The output stage includes a first output transistor and a second output transistor. The second output transistor is coupled to the first output transistor. The input stage is coupled to the output stage. The input stage includes a first cascode transistor, a first switch, a second cascode transistor, and a second switch. The first switch is coupled to the first cascode transistor and the first output transistor. The second switch is coupled to the first switch, the second cascode transistor, and the first output transistor.

20 Claims, 7 Drawing Sheets

CLASS AB BUFFER WITH MULTIPLE OUTPUT STAGES

CROSS-REFERENCE TO RELATED APPLICATIONS

This application is a continuation of U.S. patent application Ser. No. 16/395,334, filed Apr. 26, 2019, which is incorporated by reference herein in its entirety.

BACKGROUND

Circuits are often required to operate over a fairly wide range of power supply voltages. For example, an application may require that a circuit operate with power supply voltages as low as 1.6 volts and as high as 3.9 volts. Some circuits that operate over a wide power supply voltage range include analog buffers that provide multiple output stages. For example, a class AB buffer included in a circuit operating over a wide range of power supply voltages may include multiple selectable output stages, where each output stage drives different circuitry.

SUMMARY

A class AB buffer with multiple output stages is disclosed herein. In one example, a class AB buffer includes an output stage and an input stage. The output stage includes a first output transistor and a second output transistor. The second output transistor is coupled to the first output transistor. The input stage is coupled to the output stage. The input stage includes a first cascode transistor, a first switch, a second cascode transistor, and a second switch. The first switch is coupled to the first cascode transistor and the first output transistor. The second switch is coupled to the first switch, the second cascode transistor, and the first output transistor.

In another example, a class AB buffer includes an output stage and an input stage. The output stage includes a positive metal oxide semiconductor (PMOS) output transistor. The input stage includes a PMOS cascode transistor, a PMOS switch, a negative metal oxide semiconductor (NMOS) switch, and an NMOS cascode transistor. The PMOS switch includes a source terminal coupled to a drain terminal of the PMOS cascode transistor. The NMOS switch includes a drain terminal coupled to a drain terminal of the PMOS switch and a gate terminal of the PMOS output transistor. The NMOS cascode transistor includes a drain terminal coupled to a source terminal of the NMOS switch.

In a further example, a class AB buffer includes a first output stage, a second output stage, and an input stage. The first output stage includes a first PMOS output transistor and a first NMOS output transistor. The second output stage includes a second PMOS output transistor and a second NMOS output transistor. The first NMOS output transistor includes a drain terminal coupled to a drain terminal of the first PMOS output transistor. The second NMOS output transistor includes a drain terminal coupled to a drain terminal of the second PMOS output transistor. The input stage includes a first PMOS cascode transistor, a second PMOS cascode transistor, a first NMOS cascode transistor, a second NMOS cascode transistor, a first PMOS switch, a second PMOS switch, a third PMOS switch, a fourth PMOS switch, a first NMOS switch, a second NMOS switch, a third NMOS switch, and a fourth NMOS switch. The second PMOS cascode transistor includes a source terminal coupled to a source terminal of the first PMOS cascode transistor. The second NMOS cascode transistor includes a source terminal coupled to a source terminal of the first NMOS cascode transistor. The first PMOS switch includes a source terminal coupled to a drain terminal of the first PMOS cascode transistor, and a drain terminal coupled to a gate terminal of the first PMOS output transistor. The second PMOS switch includes a source terminal coupled to a drain terminal of the first PMOS cascode transistor, and a drain terminal coupled to a gate terminal of the second PMOS output transistor. The third PMOS switch includes a source terminal coupled to a drain terminal of the second PMOS cascode transistor, and a drain terminal coupled to a gate terminal of the first NMOS output transistor. The fourth PMOS switch includes a source terminal coupled to a drain terminal of the second PMOS cascode transistor, and a drain terminal coupled to a gate terminal of the second NMOS output transistor. The first NMOS switch includes a drain terminal coupled to a drain terminal of the first PMOS switch, and a source terminal coupled to a drain terminal of the first NMOS cascode transistor. The second NMOS switch includes a drain terminal coupled to a drain terminal of the second PMOS switch, and a source terminal coupled to a drain terminal of the first NMOS cascode transistor. The third NMOS switch includes a drain terminal coupled to a drain terminal of the third PMOS switch, and a source terminal coupled to a drain terminal of the second NMOS cascode transistor. The fourth NMOS switch includes a drain terminal coupled to a drain terminal of the fourth PMOS switch, and a source terminal coupled to a drain terminal of the second NMOS cascode transistor.

BRIEF DESCRIPTION OF THE DRAWINGS

For a detailed description of various examples, reference will now be made to the accompanying drawings in which.

DETAILED DESCRIPTION

Figure 1:
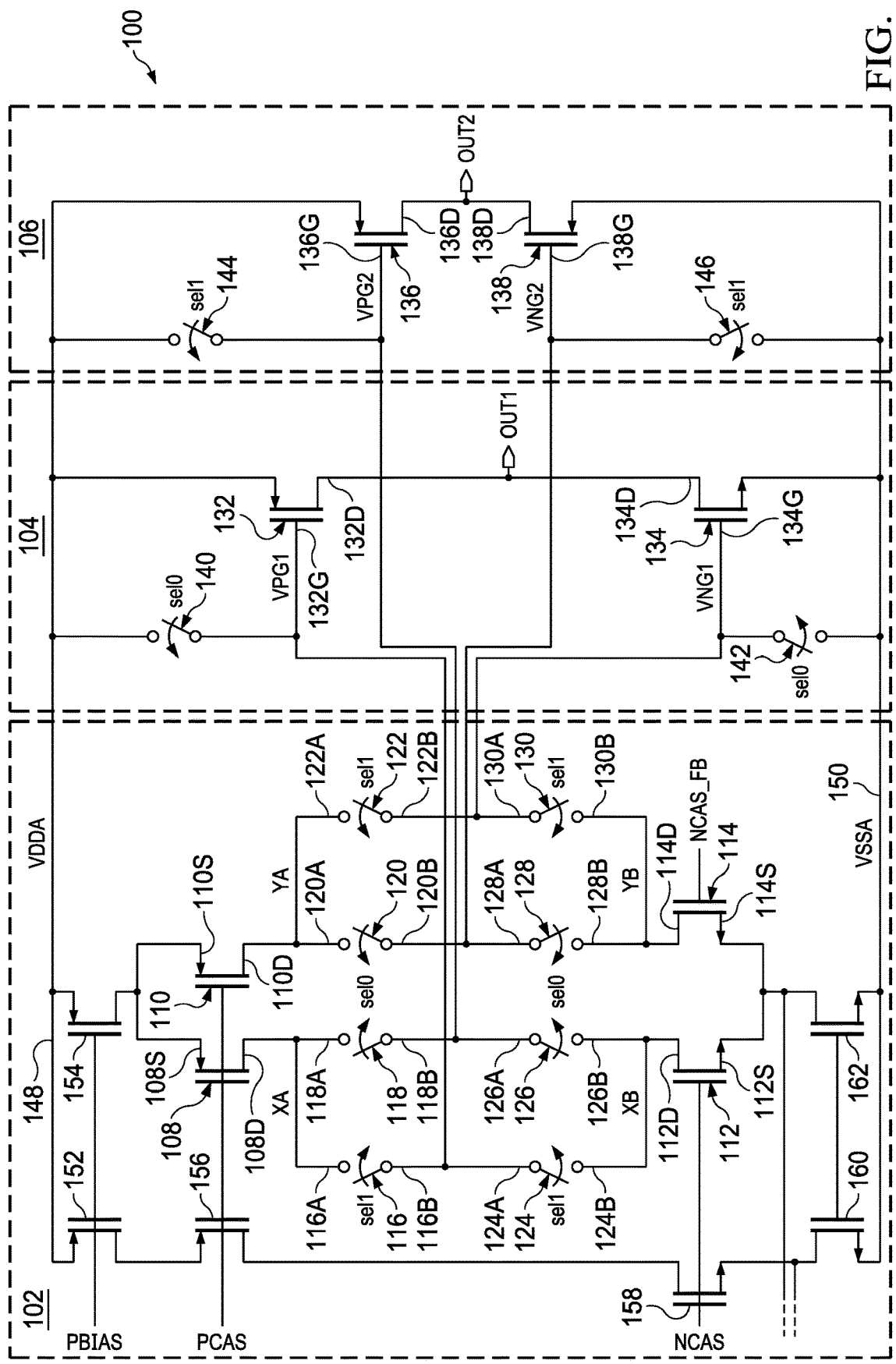
FIG. 1 shows a schematic diagram for an example class AB buffer with multiple output stages in accordance with this description.

Application of transistor switches in circuits that operate over a wide range of power supply voltages is problematic. High voltage tolerant switches do not work in the low range of power supply voltages because the gate-source voltage of the switches does not exceed the transistors threshold voltage. This causes the switch resistance (these are traditionally "voltage switches" used to choose between output stages) to be very large and tend to cause instability in an operational amplifier by adding an extra pole in the signal path. Low voltage transistors operate at the low supply voltages, but may be unreliable at high voltages.

Because transistor switches are used to select the output stages of analog buffers that include multiple output stages, the aforementioned shortcomings of transistor switches make implementation of multiple output stage analog buffers difficult. Some analog buffer implementations attempt to improve switch operation by increasing the size of the transistor switches or driving the transistors from a different power supply domain. Larger transistors increase circuit area and parasitic capacitance. Driving the transistors from a different power supply domain may require the inclusion of a power supply for a relatively limited purpose, which may introduce circuit area and power inefficiencies.

The analog buffers disclosed herein include multiple output stages with selection circuitry that can be implemented in a single transistor technology and used over a wide power supply range (e.g., the power supply voltage applied to power the analog buffer). The input stages of the analog buffers are split into multiple outputs with switches provided between the drains of the cascode transistors of the input stage. The switches are current switches rather than voltage switches. At higher power supply voltages, the switches, while ON, act like switches, and at lower power supply voltages the switches act as weak cascode transistors. Resistance of the switches does not affect buffer stability.

The analog buffers may be applied in various applications that selectably drive multiple circuits or components. For example, an implementation of the buffers disclosed herein may be used to selectively drive multiple sensors without the use of switching circuitry external to the buffer. Measurement systems may route a signal to multiple destinations (e.g., control systems, data backup systems, data acquisition systems, electronic instruments, etc.) Rather than using special cabling with multiple branches off of a single amplifier output, which can result in ground loops and other signal degradation issues, an analog buffer with multiple output stages may be used to connect a different output to each signal destination. In another application, the multiple output amplifier can be used to reduce circuit area when a signal is time-multiplexed to multiple destinations (e.g., multiple processing circuits), because the amplifier input stage is shared by the multiple output stages. Furthermore, no switching time penalty is incurred to power buffers on and off as would be found in systems that employ separate buffers to provide time multiplexing.

FIG. 1 shows a schematic diagram for an example class AB buffer 100 with multiple output stages in accordance with this description. The class AB buffer 100 includes an input stage 102, an output stage 104, and an output stage 106. Various implementations of the class AB buffer 100 include more than two output stages. The output stage 104 includes an output transistor 132, an output transistor 134, an enable switch 140, and an enable switch 142. The output stage 106 includes an output transistor 136, an output transistor 138, an enable switch 144, and an enable switch 146. No more than one of the output stage 104 or the output stage 106 is enabled at a given time. The enable switch 140 and the enable switch 142 are open to enable the output stage 104, and closed to disable the output stage 104. The enable switch 144 and the enable switch 146 are open to enable the output stage 106, and closed to disable the output stage 106. The output transistor 132 and the output transistor 136 are positive metal oxide semiconductor (PMOS) transistors, and the output transistor 134 and the output transistor 138 are negative metal oxide semiconductor (NMOS) transistors in some implementations of the class AB buffer 100.

The output stage 104 and the output stage 106 are coupled to the input stage 102. The input stage 102 includes a cascode transistor 108, a cascode transistor 110, a cascode transistor 112, and a cascode transistor 114. The cascode transistor 108 and the cascode transistor 110 are PMOS transistors and the cascode transistor 112 and the cascode transistor 114 are NMOS transistors in some implementations of the input stage 102. The cascode transistor 108 and the cascode transistor 110 are coupled to the transistor 152, the transistor 154, and the transistor 156. The cascode transistor 112 and the cascode transistor 114 are coupled to the transistor 158, the transistor 160, and the transistor 162. The source terminal 108S of the cascode transistor 108 is coupled to the source terminal 110S of the cascode transistor 110. The source terminal 112S of the cascode transistor 112 is coupled to the source terminal 114S of the cascode transistor 114. The paths for current flow between the cascode transistor 108 and the cascode transistor 112, and between the cascode transistor 110 and the cascode transistor 114, is divided into multiple branches, where each branch is coupled to a different one of the output transistors 132-138.

The cascode transistor 108 and the cascode transistor 112 are coupled via the switch 116, the switch 124, the switch 118, and the switch 126. In some implementations of the input stage 102, the switch 116 and the switch 118 are PMOS transistors, and the switch 124 and switch 126 are NMOS transistors. The drain terminal 108D of the cascode transistor 108 is coupled to a terminal 116A of the switch 116 and a terminal 118A of the switch 118. A terminal 116B of the switch 116 is coupled to a terminal 124A of the switch 124, and a terminal 118B of the switch 118 is coupled to a terminal 126A of the switch 126. A drain terminal 112D of the cascode transistor 112 is coupled to a terminal 124B of the switch 124 and a terminal 126B of the switch 126.

The cascode transistor 110 and the cascode transistor 114 are coupled via the switch 120, the switch 128, the switch 122, and the switch 130. In some implementations of the input stage 102, the switch 120 and the switch 122 are PMOS transistors, and the switch 128 and switch 130 are NMOS transistors. The drain terminal 110D of the cascode transistor 110 is coupled to a terminal 120A of the switch 120 and a terminal 122A of the switch 122. A terminal 120B of the switch 120 is coupled to a terminal 128A of the switch 128, and a terminal 122B of the switch 122 is coupled to a terminal 130A of the switch 130. A drain terminal 114D of the cascode transistor 114 is coupled to a terminal 128B of the switch 128 and a terminal 130B of the switch 130.

The switch 116, the switch 124, the switch 122, and the switch 130 are closed to enable the output stage 104, and opened to disable the output stage 104. The gate terminal 132G of the output transistor 132 is coupled to the terminal 116B of the switch 116 and the terminal 124A of the switch 124. The gate terminal 134G of the output transistor 134 is coupled to the terminal 122B of the switch 122 and the terminal 130A of the switch 130. The switch 118, the switch 126, the switch 120, and the switch 128 are closed to enable the output stage 106, and opened to disable the output stage 106. The gate terminal 136G of the output transistor 136 is coupled to the terminal 118B of the switch 118 and the terminal 126A of the switch 126. The gate terminal 138G of the output transistor 138 is coupled to the terminal 120B of the switch 120 and the terminal 128A of the switch 128.

The switch 116, the switch 118, the switch 120, the switch 122, the switch 124, the switch 126, the switch 128, and the switch 130 are current switches rather than voltage switches as provided in some implementations of a multiple output stage analog buffer. The current switches can tolerate a voltage drop across the switches. The signals that control the switches swing from the power supply rail 148 to the power supply rail 150. When the voltage drops across the current switches are large (e.g., when the output stage is lightly loaded), the current switches operate as cascodes (operating in the saturation region). When the voltage drops across the current switches are small (e.g., when sourcing/sinking large currents in the output stage), the current switches operate as switches (operating in the linear region). In low/no-load situations (e.g., no direct current (DC) current loading at the output of the class AB buffer 100), the switches (116, 122, 124, and 130 if output stage 104 is active, or switches 118, 120, 126 and 128 if output stage 106 is active) act as cascodes and there are voltage drops across the switches. In the presence of a large sourcing current, where output transistor 132 (if output stage 104 is active) or output transistor 136 (if output stage 106 is active) drives the large current, switch 124 (if output stage 104 is active) or switch 126 (if output stage 106 is active) goes into the linear region and acts as a "low resistance switch" with a very small voltage drop. Similarly, when there is large sinking current, output transistor 134 (if output stage 104 is active) or output transistor 138 (if output stage 106 is active) drives the current and switch 122 (if output stage 104 is active) or switch 120 (if output stage 106 is active) enters the linear region and acts as a "low resistance switch" with a very small voltage drop. The resistance of switches 116-130 does not adversely affect the operation of the class AB buffer 100 even at power supply voltages as low as about 1.6 volts.

Figure 2A:
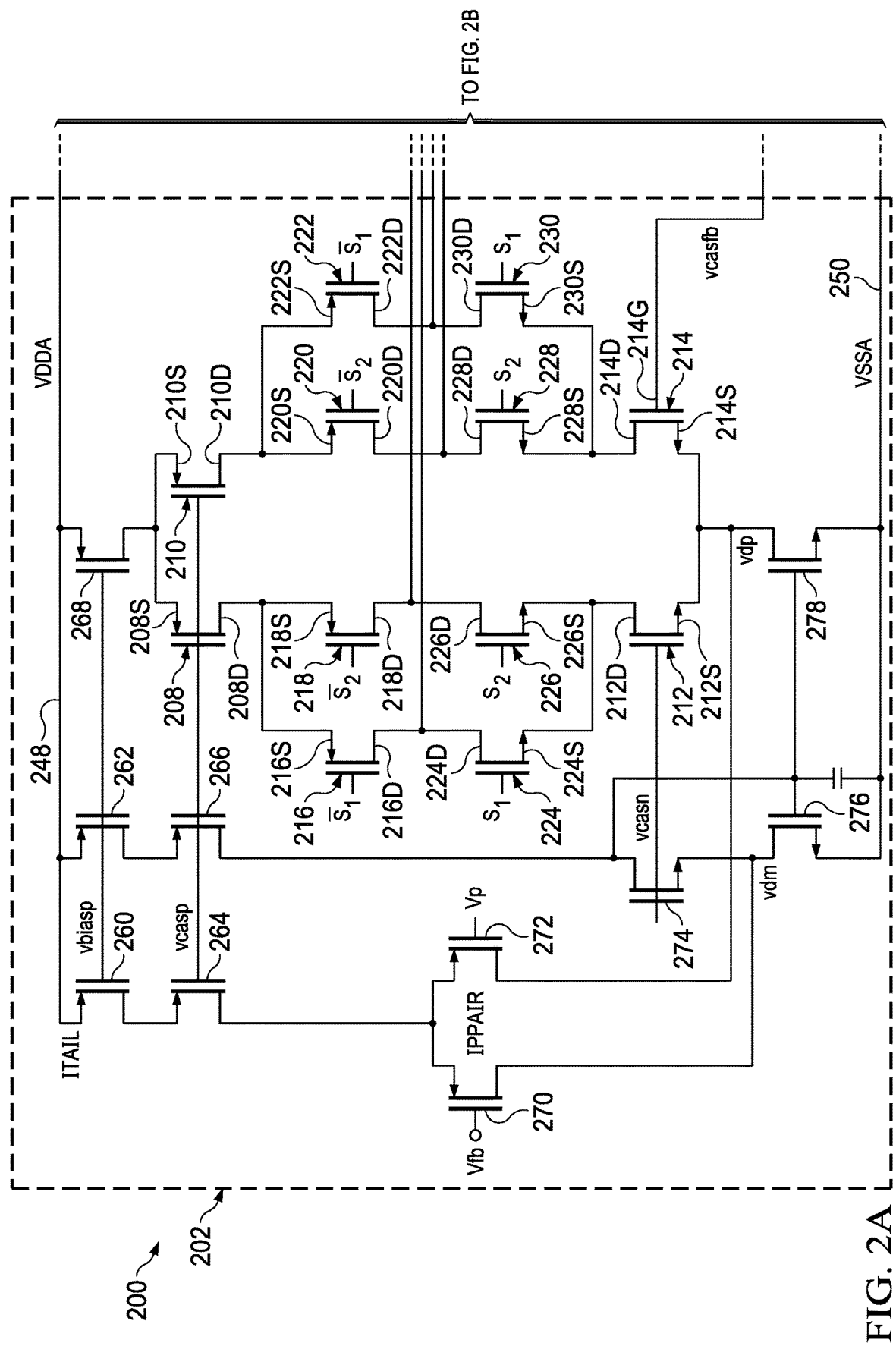
FIGS. 2A and 2B shows a schematic diagram for an example class AB buffer with multiple output stages in accordance with this description.
Figure 2B:
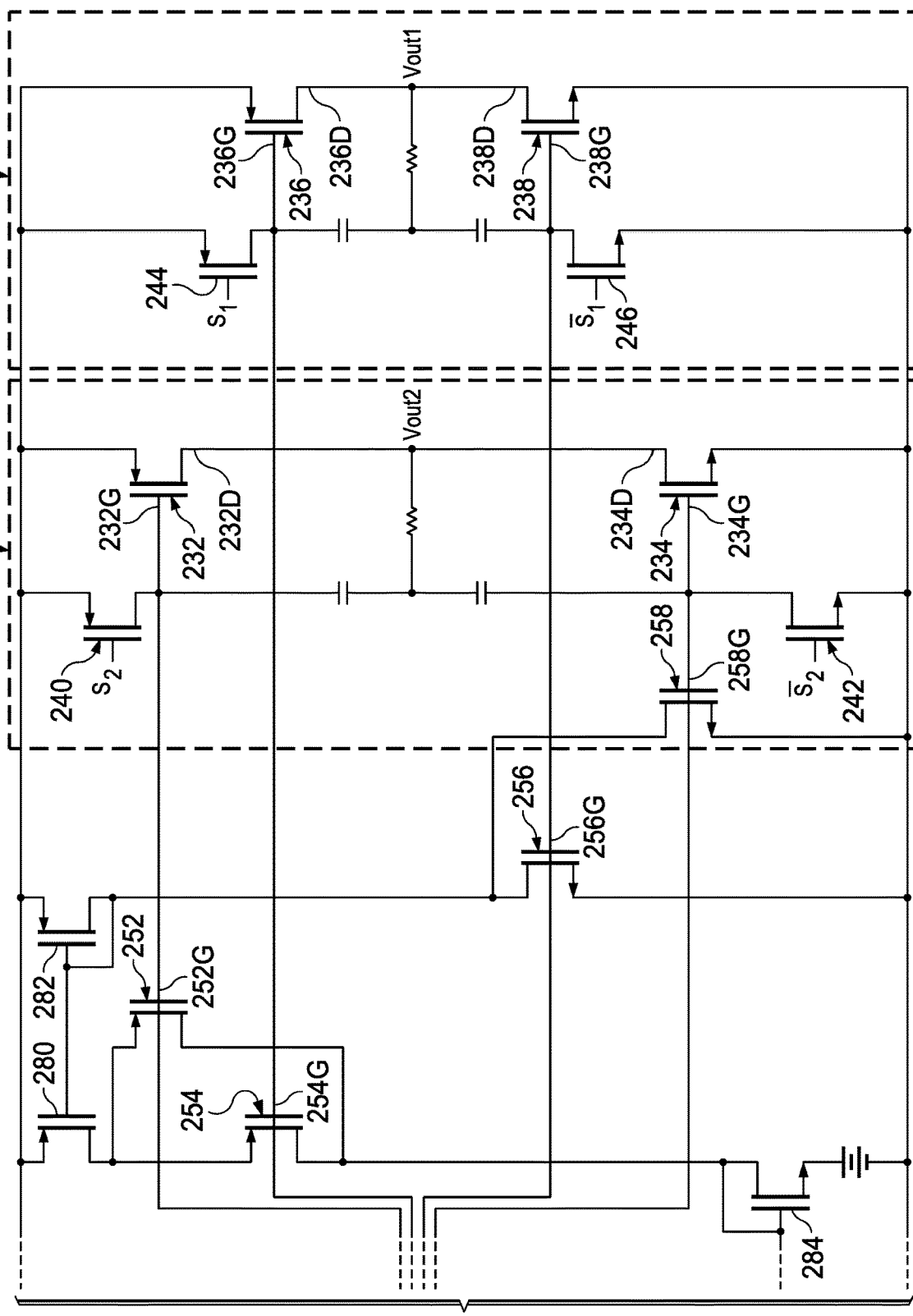

FIGS. 2A and 2B shows a schematic diagram for an example class AB buffer 200 with multiple output stages in accordance with this description. The class AB buffer 200 is an implementation of the class AB buffer 100. The class AB buffer 200 includes an input stage 202, an output stage 204, and an output stage 206. Various implementations of the class AB buffer 200 include more than two output stages. The class AB buffer 200 also includes a sense transistor 252, a sense transistor 254, a sense transistor 256, and a sense transistor 258. The output stage 204 includes an output transistor 232, an output transistor 234, a switch 240, and a switch 242. The output stage 206 includes an output transistor 236, an output transistor 238, a switch 244, and a switch 246. Only one of the output stage 204 or the output stage 206 is enabled at a given time. The switch 240 and the switch 242 are open to enable the output stage 204, and closed to disable the output stage 204. The switch 244 and the switch 246 are open to enable the output stage 206, and closed to disable the output stage 206. The output transistor 232, the output transistor 236, the switch 240, and the switch 244 are PMOS transistors, and the output transistor 234, the output transistor 238, the switch 242, and the switch 246 are NMOS transistors in some implementations of the class AB buffer 200. A drain terminal 232D of the output transistor 232 is coupled to a drain terminal 234D of the output transistor 234, and a drain terminal 236D of the output transistor 236 is coupled to a drain terminal 238D of the output transistor 238.

The output stage 204 and the output stage 206 are coupled to the input stage 202. The input stage 202 includes a cascode transistor 208, a cascode transistor 210, a cascode transistor 212, and a cascode transistor 214. The cascode transistor 208 and the cascode transistor 210 are PMOS transistors, and the cascode transistor 212 and the cascode transistor 214 are NMOS transistors in some implementations of the input stage 202. The cascode transistor 208 and the cascode transistor 210 are coupled to the transistor 260, the transistor 262, the transistor 264, the transistor 266, and the transistor 268. The cascode transistor 212 and the cascode transistor 214 are coupled to the transistor 270, the transistor 272, the transistor 274, the transistor 276, and the transistor 278. The source terminal 208S of the cascode transistor 208 is coupled to the source terminal 210S of the cascode transistor 210. The source terminal 212S of the cascode transistor 212 is coupled to the source terminal 214S of the cascode transistor 214. The cascode transistor 208 and the cascode transistor 212 are coupled via the transistor 216, the transistor 224, the transistor 218, and the transistor 226. The transistors 216, 224, 218, and 226 are implementations of the switches 116, 124, 118, and 126 respectively. In some implementations of the input stage 202, the transistor 216 and the transistor 218 are PMOS transistors, and the transistor 224 and transistor 226 are NMOS transistors. The drain terminal 208D of the cascode transistor 208 is coupled to a source terminal 216S of the transistor 216 and a source terminal 218A of the transistor 218. A drain terminal 216D of the transistor 216 is coupled to a drain terminal 224D of the transistor 224, and a drain terminal 218D of the transistor 218 is coupled to a drain terminal 226D of the transistor 226. A drain terminal 212D of the cascode transistor 212 is coupled to a source terminal 224S of the transistor 224 and a source terminal 226S of the transistor 226.

The cascode transistor 210 and the cascode transistor 214 are coupled via the transistor 220, the transistor 228, the transistor 222, and the transistor 230. The transistors 220, 228, 222, and 230 are implementations of the switches 120, 128, 122, and 130 respectively. In some implementations of the input stage 202, the transistor 220 and the transistor 222 are PMOS transistors, and the transistor 228 and transistor 230 are NMOS transistors. The drain terminal 210D of the cascode transistor 210 is coupled to a source terminal 220S of the transistor 220 and a source terminal 222S of the transistor 222. A drain terminal 220D of the transistor 220 is coupled to a drain terminal 228D of the transistor 228, and a drain terminal 222D of the transistor 222 is coupled to a drain terminal 230D of the transistor 230. A drain terminal 214D of the cascode transistor 214 is coupled to a source terminal 228S of the transistor 228 and a source terminal 230S of the transistor 230.

The transistor 216, the transistor 224, the transistor 222, and the transistor 230 are turned on to enable the output stage 204, and turned off to disable the output stage 204. The gate terminal 232G of the output transistor 232 is coupled to the drain terminal 216D of the transistor 216 and the drain terminal 224D of the transistor 224. The gate terminal 234G of the output transistor 234 is coupled to the drain terminal 222D of the transistor 222 and the drain terminal 230D of the transistor 230. The transistor 218, the transistor 226, the transistor 220, and the transistor 228 are turned on to enable the output stage 206, and turned off to disable the output stage 206. The gate terminal 236G of the output transistor 236 is coupled to the drain terminal 218D of the transistor 218 and the drain terminal 226D of the transistor 226. The gate terminal 238G of the output transistor 238 is coupled to the drain terminal 220D of the transistor 220 and the drain terminal 228D of the transistor 228.

The sense transistor 252, the sense transistor 254, the sense transistor 256, and the sense transistor 258 sense current flow in the output transistor 232, the output transistor 236, the output transistor 238, and the output transistor 234 respectively, and provide feedback to the input stage 102 (e.g., to the gate terminal 214G of the cascode transistor 214) for control of class AB operation. The gate terminal 252G of the sense transistor 252 is coupled to the gate terminal 232G of the output transistor 232. The gate terminal 258G of the sense transistor 258 is coupled to the gate terminal 234G of the output transistor 234. The gate terminal 254G of the sense transistor 254 is coupled to the gate terminal 236G of the output transistor 236. The gate terminal 256G of the sense transistor 256 is coupled to the gate terminal 238G of the output transistor 238. The sense transistor 252 and the sense transistor 254 are coupled to the transistor 280, the transistor 282, and the transistor 284.

In one operational example, the output stage 206 is selected with the power supply rail 248 at 1.6 volts. The voltage at the gate terminals of the transistors 216 and 222 is 0 volts, and the voltage at the gate terminals of the transistors 224 and 230 is 1.6 volts. The voltage at the gate terminal 236G of the output transistor 236 is about 0.8 volts. The voltage at the source terminal 216S of the transistor 216 is about 1 volts, and the voltage at the source terminal 224S of the transistor 224 is about 0.6 volts. Similarly, the voltage at the gate terminal 238G of the output transistor 238 is about 0.8 volts. The voltage at the source terminal 222S of the transistor 222 is about 1 volts, and the voltage at the source terminal 230S of the transistor 230 is about 0.6 volts. Because the transistors 216 and 222 are current switches, some voltage drop can be tolerated. In this configuration the transistors 216, 222, 224, and 230 operate as cascode transistors, and the resistance thereof does not affect stability.

In a second operational example, the output stage 206 is selected with the power supply rail 248 at 1.6 volts, and a large load current (e.g., 1 milli-ampere) is flowing through the output transistor 236. The voltage at the gate terminals of the transistors 216 and 222 is 0 volts, and the voltage at the gate terminals of the transistors 224 and 230 is 1.6 volts. The voltage at the gate terminal 236G of the output transistor 236 is about 0.4 volts. The voltage at the source terminal 216S of the transistor 216 is about 1 volt, and the voltage at the source terminal 224S of the transistor 224 is about 0.35 volts. The voltage at the gate terminal 238G of the output transistor 238 is about 1.2 volts. The voltage at the source terminal 222S of the transistor 222 is about 1.3 volts, and the voltage at the source terminal 230S of the transistor 230 is about 0.6 volts. In this configuration the transistors 216 and 230 operate as cascode transistors, and the transistors 224 and 222 operate as low resistance switches, and the resistance of the transistors does not affect stability.

Figure 3A:
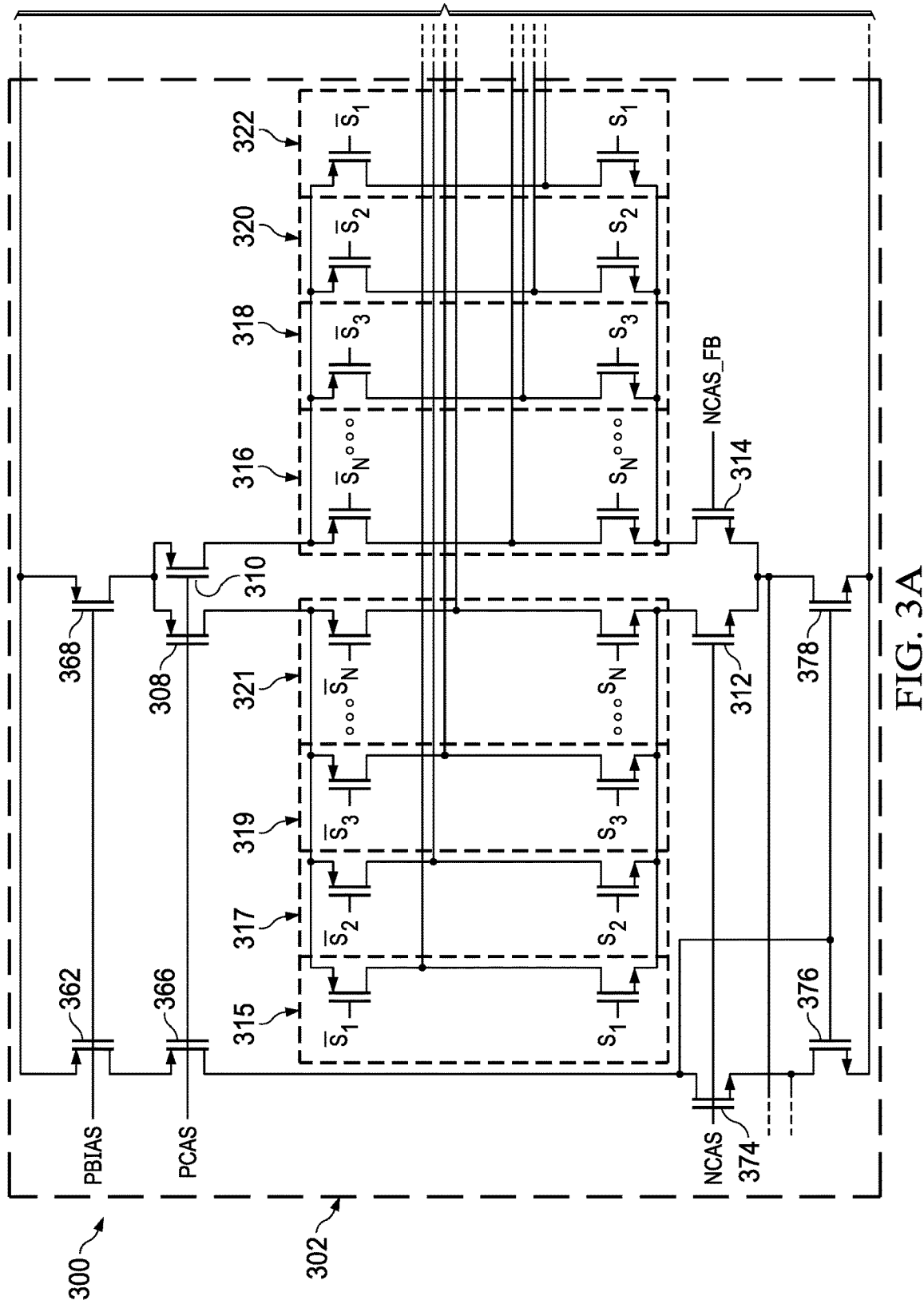
FIGS. 3A and 3B shows a schematic diagram for an example class AB buffer with more than two output stages in accordance with this description.
Figure 3B:
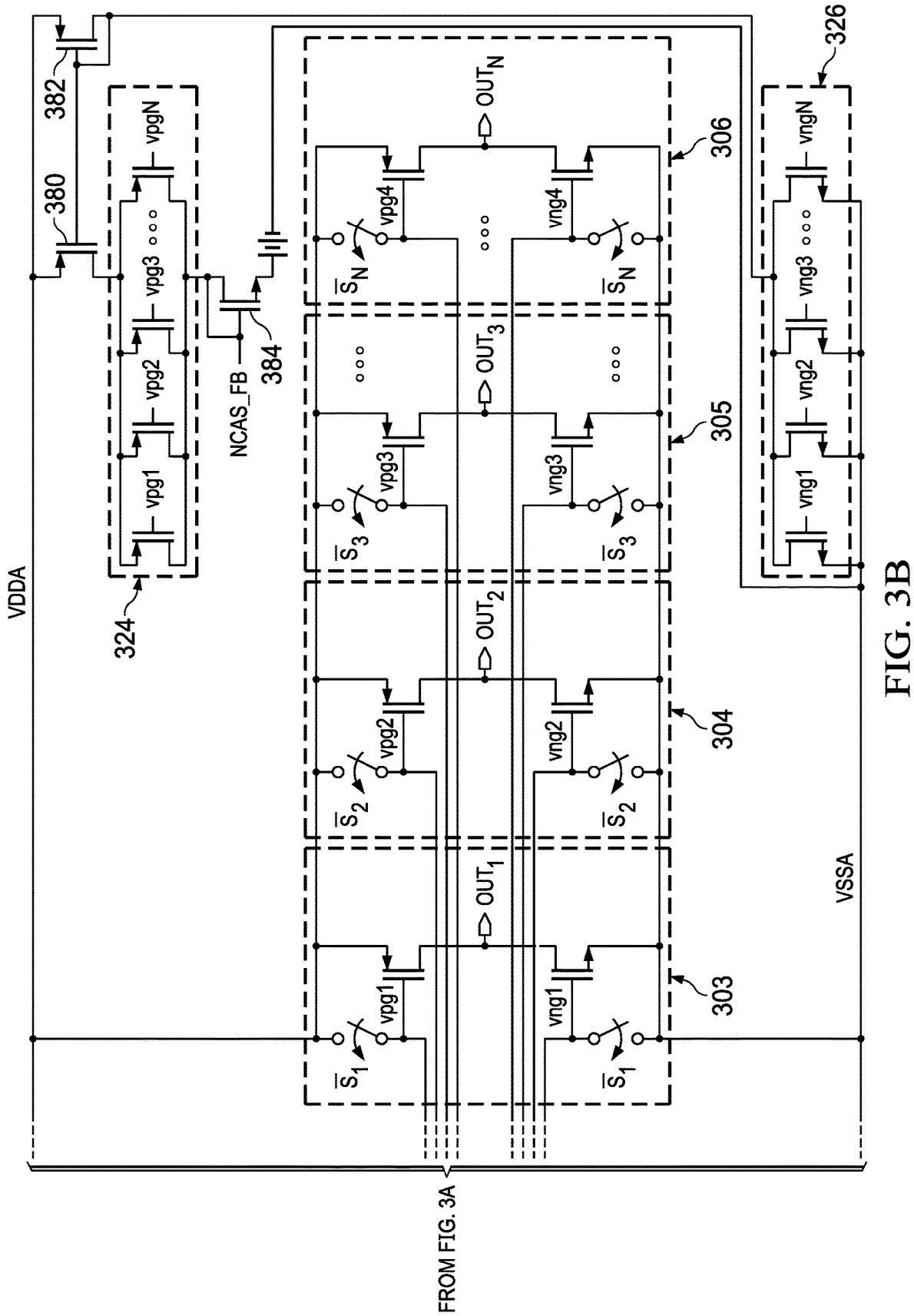

FIGS. 3A and 3B shows a schematic diagram for an example class AB buffer 300 with more than two output stages in accordance with this description. The class AB buffer 300 is an implementation of the class AB buffer 100, but includes N output stage, where N is greater than two. Implementations of the class AB buffer 100 and the class AB buffer 300 may include two or more output stages. The class AB buffer 300 includes an input stage 302, an output stage 303, an output stage 304, an output stage 305, and an output stage 306. Each output stage includes a PMOS output transistor, an NMOS output transistor, a switch that selectably couples the gate of the PMOS output transistor to a power rail to enable or disable the output stage, and a switch that selectably couples the gate of the NMOS output transistor to a power rail to enable or disable the output stage. Only one of the output stages is enabled at a given time.

The output stage 303, the output stage 304, the output stage 305, and the output stage 306 are coupled to the input stage 302. The input stage 302 includes a cascode transistor 308, a cascode transistor 310, a cascode transistor 312, and a cascode transistor 314. The cascode transistor 308 and the cascode transistor 310 are PMOS transistors and the cascode transistor 312 and the cascode transistor 314 are NMOS transistors in some implementations of the input stage 302. The cascode transistor 308 and the cascode transistor 310 are coupled to the transistor 362, the transistor 366, and the transistor 368. The cascode transistor 312 and the cascode transistor 314 are coupled to the transistor 374, the transistor 376, and the transistor 378. The drain terminal of the cascode transistor 308 is coupled to the drain terminal of the cascode transistor 312 via the transistors 315, the transistors 317, the transistors 319, and the transistors 321. The drain terminal of the cascode transistor 310 is coupled to the drain terminal of the cascode transistor 314 via the transistors 316, the transistors 318, the transistors 320, and the transistors 322. The transistors 315 are coupled to the gate terminal of the PMOS transistor of the output stage 303, and the transistors 316 are coupled to the gate terminal of the NMOS transistor of the output stage 303. The transistors 317 are coupled to the gate terminal of the PMOS transistor of the output stage 304, and the transistors 318 are coupled to the gate terminal of the NMOS transistor of the output stage 304. The transistors 319 are coupled to the gate terminal of the PMOS transistor of the output stage 305, and the transistors 320 are coupled to the gate terminal of the NMOS transistor of the output stage 305. The transistors 321 are coupled to the gate terminal of the PMOS transistor of the output stage 306, and the transistors 322 are coupled to the gate terminal of the NMOS transistor of the output stage 306.

The sense transistors 324 are coupled to the PMOS transistors of the output stages 303-306, and the sense transistors 326 are coupled to the NMOS transistors of the output stages 303-306. The sense transistors 324, 326 provide feedback to the cascode transistor 314 to enable class AB operation. The sense transistors 324, 326 are coupled to the transistor 380, the transistor 382, and the transistor 384.

Figure 4A:
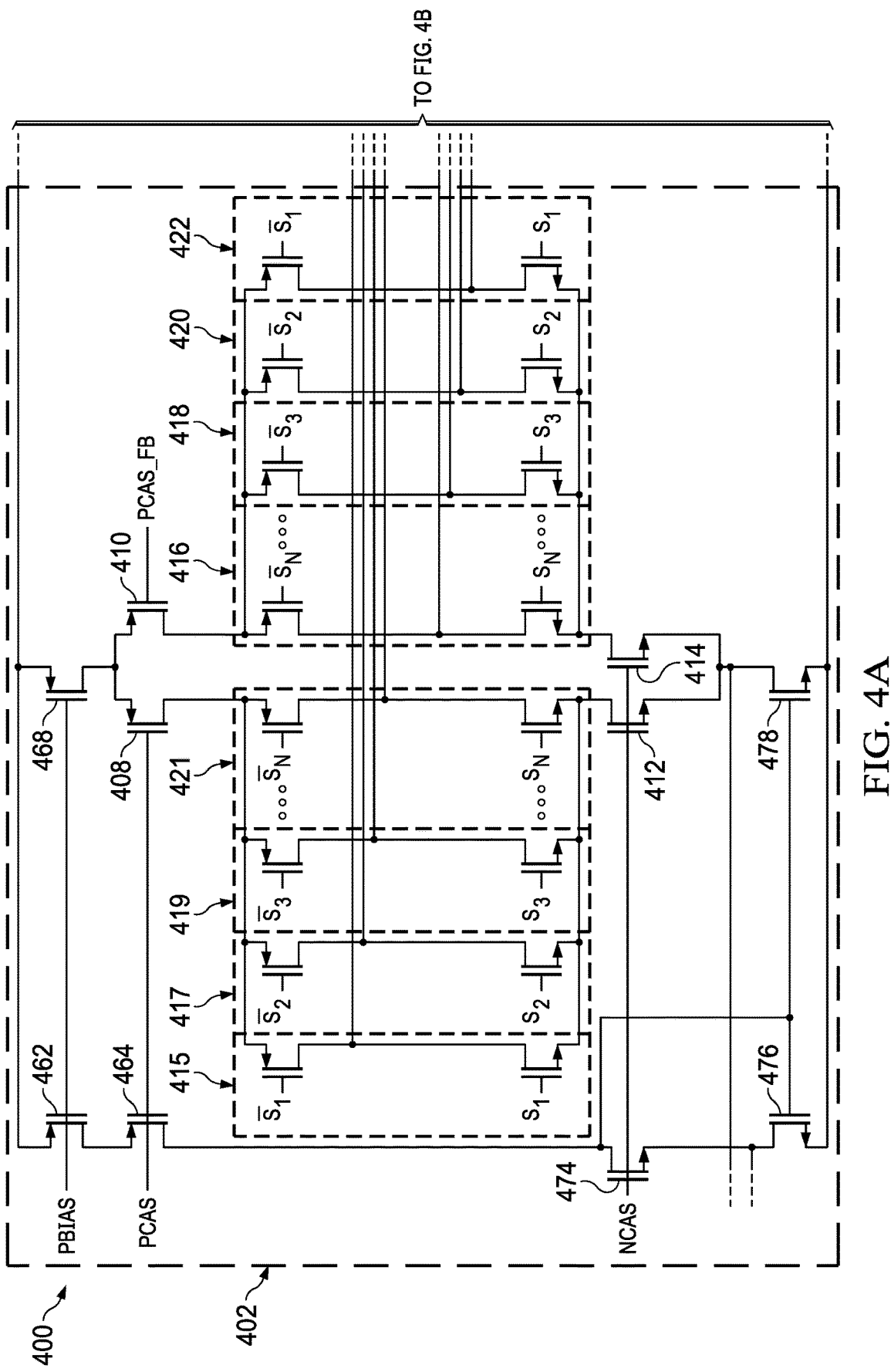
FIGS. 4A and 4B shows a schematic diagram for an example class AB buffer with multiple output stages and P-side class AB feedback in accordance with this description.
Figure 4B:
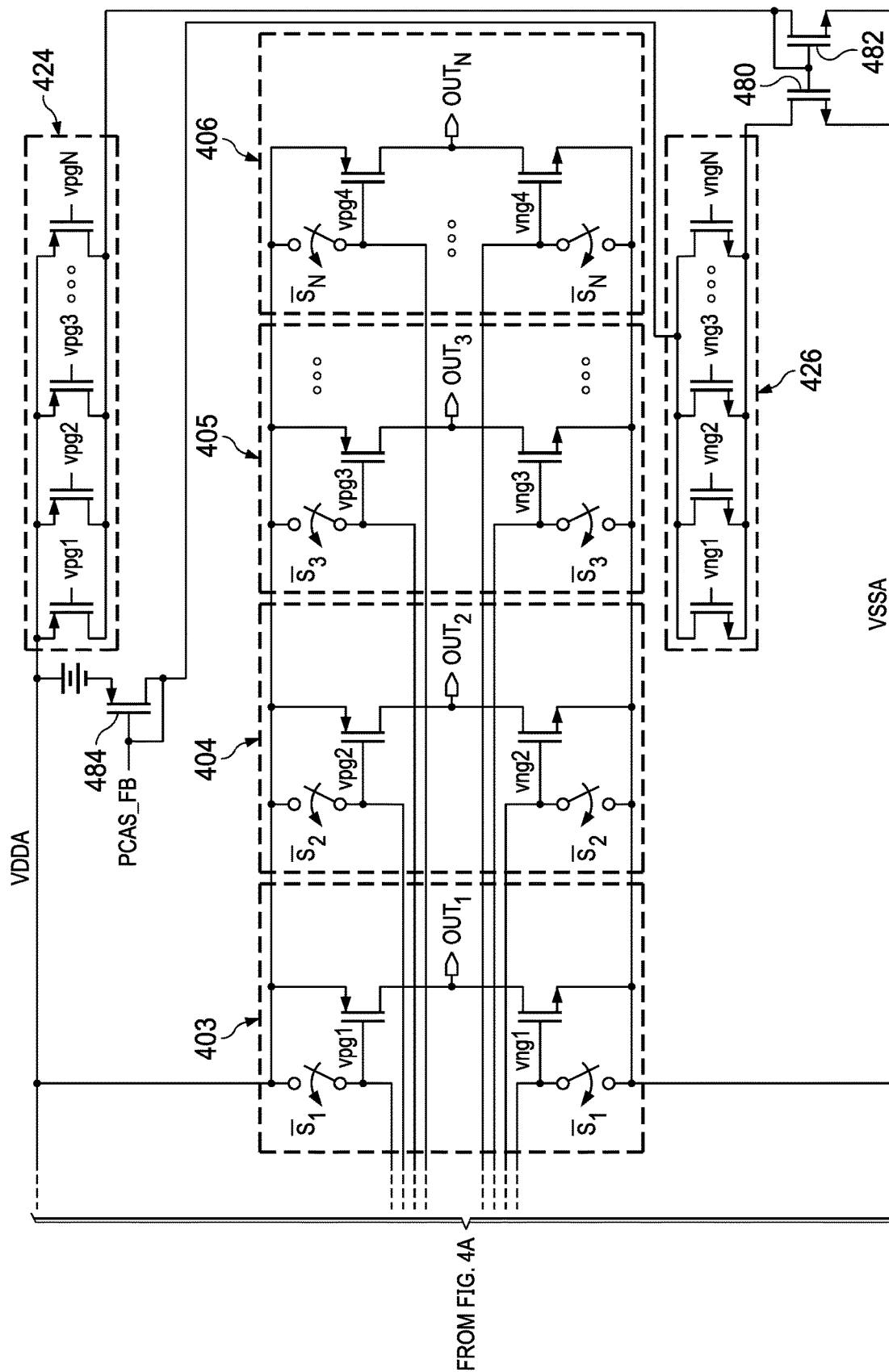

FIGS. 4A and 4B shows a schematic diagram for an example class AB buffer 400 with multiple output stages and P-side class AB feedback in accordance with this description. The class AB buffer 400 is an implementation of the class AB buffer 300, but includes feedback to the P-side cascodes rather than the N-side cascodes. The class AB buffer 400 includes an input stage 402, an output stage 403, an output stage 404, an output stage 405, and an output stage 406. Each output stage includes a PMOS output transistor an NMOS output transistor, a switch that selectably couples the gate of the PMOS output transistor to a power rail to enable or disable the output stage, and a switch that selectably couples the gate of the NMOS output transistor to a power rail to enable or disable the output stage. Only one of the output stages is enabled at a given time.

The output stage 403, the output stage 404, the output stage 405, and the output stage 406 are coupled to the input stage 402. The input stage 402 includes a cascode transistor 408, a cascode transistor 410, a cascode transistor 412, and a cascode transistor 414. The cascode transistor 408 and the cascode transistor 410 are PMOS transistors, and the cascode transistor 412 and the cascode transistor 414 are NMOS transistors in some implementations of the input stage 402. The cascode transistor 408 and the cascode transistor 410 are coupled to the transistor 462, the transistor 464, and the transistor 468. The cascode transistor 412 and the cascode transistor 414 are coupled to the transistor 474, the transistor 476, and the transistor 478. The drain terminal of the cascode transistor 408 is coupled to the drain terminal of the cascode transistor 412 via the transistors 415, the transistors 417, the transistors 419, and the transistors 421. The drain terminal of the cascode transistor 410 is coupled to the drain terminal of the cascode transistor 414 via the transistors 416, the transistors 418, the transistors 420, and the transistors 422. The transistors 415 are coupled to the gate terminal of the PMOS transistor of the output stage 403, and the transistors 416 are coupled to the gate terminal of the NMOS transistor of the output stage 403. The transistors 417 are coupled to the gate terminal of the PMOS transistor of the output stage 404, and the transistors 418 are coupled to the gate terminal of the NMOS transistor of the output stage 404. The transistors 419 are coupled to the gate terminal of the PMOS transistor of the output stage 405, and the transistors 420 are coupled to the gate terminal of the NMOS transistor of the output stage 405. The transistors 421 are coupled to the gate terminal of the PMOS transistor of the output stage 406, and the transistors 422 are coupled to the gate terminal of the NMOS transistor of the output stage 406.

The sense transistors 424 are coupled to the PMOS transistors of the output stages 403-406, and the sense transistors 426 are coupled to the NMOS transistors of the output stages 403-406. The sense transistors 424, 426 provide feedback to the cascode transistor 410 to enable class AB operation. The sense transistors 426 are coupled to the transistor 480, the transistor 482, and the transistor 484.

While implementations of a buffer amplifier with multiple output stage have been discussed herein with reference to MOS transistors, some examples of the buffer amplifiers may be implemented with other types of transistors, such as bipolar junction transistors, junction field effect transistors, or other types of transistors, including combinations of different transistor types.

Modifications are possible in the described embodiments, and other embodiments are possible, within the scope of the claims.

What is claimed is:

1. A buffer circuit comprising:
   an input stage that includes:
      a first cascode input;
      a second cascode input;
      a set of output nodes;
      a first transistor coupled between a first node and a second node, wherein the first transistor includes a gate coupled to the first cascode input;
      a first switch coupled between the second node and a first output node of the set of output nodes;
      a second switch coupled between the first output node and a third node;
      a third switch coupled between the second node and a second output node of the set of output nodes;
      a fourth switch coupled between the second output node and the third node;
      a second transistor coupled between the third node and a fourth node, wherein the second transistor includes a gate coupled to the second cascode input;
      a third transistor coupled between the first node and a fifth node, wherein the third transistor includes a gate coupled to the first cascode input;
      a fifth switch coupled between the fifth node and a third output node of the set of output nodes;
      a sixth switch coupled between the third output node and a sixth node;
      a seventh switch coupled between the fifth node and a fourth output node of the set of output nodes;
      an eighth switch coupled between the fourth output node and the sixth node; and
      a fourth transistor coupled between the sixth node and the fourth node;
   a first output stage that includes:
      a first output;
      a first cascode transistor coupled to the first output, wherein the first cascode transistor includes a gate coupled to the first output node of the input stage; and
      a second cascode transistor coupled to the first output, wherein the second cascode transistor includes a gate coupled to the fourth output node of the input stage; and
   a second output stage that includes:
      a second output;
      a third cascode transistor coupled to the second output, wherein the third cascode transistor includes a gate coupled to the second output node of the input stage; and
      a fourth cascode transistor coupled to the second output, wherein the fourth cascode transistor includes a gate coupled to the third output node of the input stage.

2. The buffer circuit of claim 1 further comprising a first power rail and a second power rail, wherein:
   the first cascode transistor and the second cascode transistor are cascode coupled between the first power rail and the second power rail; and
   the third cascode transistor and the fourth cascode transistor are cascode coupled between the first power rail and the second power rail.

3. The buffer circuit of claim 2, wherein the first output stage includes:
   a ninth switch coupled between the first power rail and the gate of the first cascode transistor; and
   a tenth switch coupled between the second power rail and the gate of the second cascode transistor.

4. The buffer circuit of claim 3, wherein the second output stage includes:
   an eleventh switch coupled between the first power rail and the gate of the third cascode transistor; and
   a twelfth switch coupled between the second power rail and the gate of the fourth cascode transistor.

5. The buffer circuit of claim 4, wherein:
   each of: the first switch, the second switch, the seventh switch, the eighth switch, the eleventh switch and the twelfth switch are configured to switch based on a first select signal; and
   each of: the third switch, the fourth switch, the fifth switch, the sixth switch, the ninth switch and the tenth switch are configured to switch based on a second select signal.

6. The buffer circuit of claim 2, wherein the input stage further includes:
   a bias transistor coupled between the first power rail and the first node; and
   a fifth transistor coupled between the fourth node and the second power rail.

7. The buffer circuit of claim 6, wherein:
   the input stage further includes a set of transistors cascode coupled between the first power rail and the second power rail; and
   the set of transistors includes:
      a sixth transistor that includes a gate coupled to a gate of the bias transistor;
      a seventh transistor that includes a gate coupled to the first cascode input;
      an eighth transistor that includes a gate coupled to the second cascode input; and
      a ninth transistor that includes a gate coupled to a gate of the fifth transistor.

8. The buffer circuit of claim 1 further comprising a set of sense transistors configured to provide a feedback signal, wherein the fourth transistor includes a gate coupled to receive the feedback signal.

9. The buffer circuit of claim 1, wherein:
the first output stage includes:
  a first capacitor coupled between the gate of the first cascode transistor and a seventh node;
  a second capacitor coupled between the gate of the second cascode transistor and the seventh node; and
  a first resistor coupled between the seventh node and the first output; and
the second output stage includes:
  a third capacitor coupled between the gate of the third cascode transistor and an eighth node;
  a fourth capacitor coupled between the gate of the fourth cascode transistor and the eighth node; and
  a second resistor coupled between the eighth node and the second output.

10. A buffer circuit comprising:
an input stage that includes:
  a first output configured to provide a first signal based on a first switching signal;
  a first transistor coupled between a first node and a second node;
  a first switch coupled to the second node and the first output;
  a second switch coupled to the first output and a third node;
  a second transistor coupled between the third node and a fourth node;
  a second output configured to provide a second signal based on a second switching signal;
  a third switch coupled between the second node and the second output;
  a fourth switch coupled between the second output and the third node;
  a third output configured to provide a third signal based on the second switching signal; and
  a fourth output configured to provide a fourth signal based on the first switching signal;
a first output stage that includes:
  a first buffer output;
  a first cascode transistor coupled to the first buffer output, wherein the first cascode transistor includes a gate coupled to the first output of the input stage; and
  a second cascode transistor coupled to the first buffer output, wherein the second cascode transistor includes a gate coupled to the fourth output of the input stage; and
a second output stage that includes:
  a second buffer output;
  a third cascode transistor coupled to the second buffer output, wherein the third cascode transistor includes a gate coupled to the second output of the input stage; and
  a fourth cascode transistor coupled to the second buffer output, wherein the fourth cascode transistor includes a gate coupled to the third output of the input stage.

11. The buffer circuit of claim 10, wherein:
the first output stage includes:
  a fifth switch coupled between the gate of the first cascode transistor and a first power rail, wherein the fifth switch is coupled to switch based on the second switching signal; and
  a sixth switch coupled between the gate of the second cascode transistor and a second power rail, wherein the sixth switch is coupled to switch based on the second switching signal; and
the second output stage includes:
  a seventh switch coupled between the gate of the third cascode transistor and the first power rail, wherein the seventh switch is coupled to switch based on the first switching signal; and
  a eighth switch coupled between the gate of the fourth cascode transistor and the second power rail, wherein the eighth switch is coupled to switch based on the first switching signal.

12. The buffer circuit of claim 11, wherein:
the first output stage includes:
  a first capacitor coupled between the gate of the first cascode transistor and a first node;
  a second capacitor coupled between the gate of the second cascode transistor and the first node; and
  a first resistor coupled between the first node and the first buffer output; and
the second output stage includes:
  a third capacitor coupled between the gate of the third cascode transistor and a second node;
  a fourth capacitor coupled between the gate of the fourth cascode transistor and the second node; and
  a second resistor coupled between the second node and the second buffer output.

13. The buffer circuit of claim 11, wherein:
the first transistor is a first p-type transistor;
the second transistor is a first n-type transistor; and
the input stage further includes:
  a second p-type transistor coupled between the first node and a fifth node;
  a ninth switch coupled between the fifth node and the third output of the input stage;
  a tenth switch coupled between the third output of the input stage and a sixth node;
  an eleventh switch coupled between the fifth node and the fourth output of the input stage;
  a twelfth switch coupled between the fourth output of the input stage and the sixth node; and
  a second n-type transistor coupled between the sixth node and the fourth node.

14. The buffer circuit of claim 13, wherein:
each of: the first switch, the second switch, the eleventh switch, and the twelfth switch are configured to switch based on the first switching signal; and
each of: the third switch, the fourth switch, the ninth switch, and the tenth switch are configured to switch based on the second switching signal.

15. The buffer circuit of claim 13, wherein the input stage further includes:
a third p-type transistor coupled between the first power rail and the first node; and
a third n-type transistor coupled between the fourth node and the second power rail.

16. The buffer circuit of claim 15, wherein:
the input stage further includes a set of transistors cascode coupled between the first power rail and the second power rail; and
the set of transistors includes:
  a fourth p-type transistor that includes a gate coupled to a gate of the third p-type transistor;
  a fifth p-type transistor that includes a gate coupled to a gate of the first p-type transistor;
  a fourth n-type transistor that includes a gate coupled to a gate of the first n-type transistor; and
  a fifth n-type transistor that includes a gate coupled to a gate of the third n-type transistor.

17. The buffer circuit of claim 13, wherein a gate of the second n-type transistor is coupled to receive a feedback signal.

18. The buffer circuit of claim 13, wherein a gate of the second p-type transistor is coupled to receive a feedback signal.

19. A buffer circuit comprising:
an input stage comprising:
a first cascode input;
a second cascode input;
a set of output nodes;
a first transistor coupled between a first node and a second node, wherein the first transistor includes a gate coupled to the first cascode input;
a first switch coupled between the second node and a first output node of the set of output nodes;
a second switch coupled between the first output node and a third node;
a third switch coupled between the second node and a second output node of the set of output nodes;
a fourth switch coupled between the second output node and the third node;
a second transistor coupled between the third node and a fourth node, wherein the second transistor includes a gate coupled to the second cascode input;
a third transistor coupled between the first node and a fifth node, wherein the third transistor includes a gate coupled to receive a feedback signal;
a fifth switch coupled between the fifth node and a third output node of the set of output nodes;
a sixth switch coupled between the third output node and a sixth node;
a seventh switch coupled between the fifth node and a fourth output node of the set of output nodes;
an eighth switch coupled between the fourth output node and the sixth node; and
a fourth transistor coupled between the sixth node and the fourth node, wherein the fourth transistor includes a gate coupled to the second cascode input;
a first output stage that includes:
a first output;
a first cascode transistor coupled to the first output, wherein the first cascode transistor includes a gate coupled to the first output node of the input stage; and
a second cascode transistor coupled to the first output, wherein the second cascode transistor includes a gate coupled to the fourth output node of the input stage; and
a second output stage that includes:
a second output;
a third cascode transistor coupled to the second output, wherein the third cascode transistor includes a gate coupled to the second output node of the input stage; and
a fourth cascode transistor coupled to the second output, wherein the fourth cascode transistor includes a gate coupled to the third output node of the input stage.

20. The buffer circuit of claim 19, further comprising a set of sense transistors configured to provide the feedback signal.

* * * * *